(12) United States Patent
Kapoor

(10) Patent No.: US 7,772,620 B2
(45) Date of Patent: Aug. 10, 2010

(54) JUNCTION FIELD EFFECT TRANSISTOR USING A SILICON ON INSULATOR ARCHITECTURE

(75) Inventor: Ashok K. Kapoor, Palo Alto, CA (US)

(73) Assignee: SuVolta, Inc., Los Gatos, CA (US)

( * ) Notice: Subject to any disclaimer, the term of this patent is extended or adjusted under 35 U.S.C. 154(b) by 199 days.

(21) Appl. No.: 12/180,158

(22) Filed: Jul. 25, 2008

(65) Prior Publication Data
US 2010/0019290 A1    Jan. 28, 2010

(51) Int. Cl.
H01L 29/80 (2006.01)
H01L 31/112 (2006.01)
H01L 29/00 (2006.01)

(52) U.S. Cl. .............. 257/256; 257/272; 257/504; 257/E29.226; 257/E29.273; 257/E29.275; 257/E29.276; 257/E29.314; 257/E29.319; 257/E29.32

(58) Field of Classification Search ............ 257/256, 257/272, 504, E29.226, E29.273, E29.275, 257/E29.276, E29.314, E29.319, E29.32
See application file for complete search history.

(56) References Cited

U.S. PATENT DOCUMENTS

| | | | | |
|---|---|---|---|---|
| 5,406,096 A | * | 4/1995 | Malhi | 257/114 |
| 6,163,052 A | * | 12/2000 | Liu et al. | 257/334 |
| 7,019,342 B2 | * | 3/2006 | Hackler et al. | 257/250 |
| 7,202,528 B2 | * | 4/2007 | Sankin et al. | 257/341 |
| 7,314,794 B2 | | 1/2008 | Nowak | 438/231 |
| 7,518,189 B1 | * | 4/2009 | Hackler et al. | 257/347 |
| 2007/0284626 A1 | | 12/2007 | Vora et al. | 257/256 |
| 2008/0001183 A1 | * | 1/2008 | Kapoor | 257/256 |
| 2008/0100377 A1 | | 5/2008 | Kerns | 327/581 |
| 2008/0128705 A1 | | 6/2008 | Ishiguro | 257/72 |
| 2008/0272406 A1 | * | 11/2008 | Banna | 257/270 |
| 2008/0308816 A1 | | 12/2008 | Miller et al. | 257/76 |
| 2009/0101940 A1 | * | 4/2009 | Barrows et al. | 257/204 |
| 2009/0108351 A1 | * | 4/2009 | Yang et al. | 257/347 |
| 2009/0212363 A1 | * | 8/2009 | Krivokapic | 257/347 |
| 2009/0302355 A1 | * | 12/2009 | Pekarik et al. | 257/256 |
| 2010/0032731 A1 | * | 2/2010 | Babcock et al. | 257/280 |

OTHER PUBLICATIONS

*PCT Notification of Transmittal of the International Search Report and the Written Opinion of the International Searching Authority* for International Application No. PCT/US2009/049663; 10 pages, Feb. 17, 2010.

* cited by examiner

*Primary Examiner*—Ida M Soward
(74) *Attorney, Agent, or Firm*—Baker Botts L.L.P.

(57) ABSTRACT

A junction field effect transistor comprises a silicon-on-insulator architecture. A front gate region and a back gate region are formed in a silicon region of the SOI architecture. The silicon region has a thin depth such that the back gate region has a thin depth, and whereby a depletion region associated with the back gate region recedes substantially up to an insulating layer of the SOI architecture.

22 Claims, 1 Drawing Sheet

JUNCTION FIELD EFFECT TRANSISTOR USING A SILICON ON INSULATOR ARCHITECTURE

TECHNICAL FIELD OF THE INVENTION

The present disclosure relates generally to semiconductor devices and more particularly to a junction field effect transistor using a silicon-on-insulator architecture.

BACKGROUND OF THE INVENTION

Prior junction field effect transistors use a grounded well region in which to build the active regions of the transistor. This grounded well region has the effect of reducing the drive current in the ON-state of operation for the transistor. As a result, the Ion/Ioff ratio of such a transistor is not optimal. Some junction field effect transistors use back gate regions in addition to front gate regions. Depending on the dimensions of the front and back gate regions, the capacitance of the transistor device may be high, resulting in slower switching times and poor Ion/Ioff ratios.

SUMMARY OF THE INVENTION

In accordance with the present invention, the disadvantages and problems associated with prior junction field effect transistors have been substantially reduced or eliminated.

In accordance with one embodiment of the present invention, a junction field effect transistor comprises a silicon-on-insulator architecture. A front gate region and a back gate region are formed in a silicon region of the SOI architecture. The silicon region has a thin depth such that the back gate region has a thin depth, and whereby a depletion region associated with the back gate region recedes substantially up to an insulating layer of the SOI architecture.

In a particular embodiment, a junction field effect transistor comprises a semiconductor substrate and an insulating layer formed on the semiconductor substrate. A silicon region is formed on the insulating layer, wherein the silicon region has a depth ranging from ten to sixty nanometers. A source region of a first conductivity type is formed in the silicon region. A drain region of the first conductivity type is formed in the silicon region and spaced apart from the source region. A channel region of the first conductivity type is located between the source and drain regions and formed in the silicon region. A first gate region of a second conductivity type is formed in the silicon region adjacent to a top of the silicon region. A second gate region of the second conductivity type is formed in the silicon region adjacent to a bottom of the silicon region.

The following technical advantages may be achieved by some, none, or all of the embodiments of the present invention.

The gate capacitance of a JFET includes the capacitance of a front gate region plus the capacitance of a back gate region. As the area of the back gate region is generally substantially larger than the area of the front gate region, the capacitance of the semiconductor device contributed by the front and back gate regions is dominated by the capacitance contributed by the back gate region. In one embodiment, the area of the back gate region of a semiconductor device is reduced substantially by reducing the thickness of the back gate region. This reduction in thickness of the back gate region is applied in conjunction with a reduction in thickness of a silicon region of a silicon-on-insulator (SOI) architecture of the semiconductor device. As a result, the overall capacitance of the semiconductor device is reduced by the reduction in area of the back gate region. This reduction in capacitance leads to faster switching speeds for the semiconductor device and improved Ion/Ioff ratios.

Reducing the thickness of the back gate region may also have other advantages. For example, upon the application of an appropriate voltage to operate the transistor in an ON-state, a depletion region associated with the reduced back gate region will recede substantially up to the insulating layer of the SOI architecture. With this depletion region only receding up to the insulating layer, when appropriate voltages are applied to the transistor to operate it in an OFF-state, the spread of the depletion region associated with back gate region in the channel region can happen more quickly and/or more robustly than other depletion regions associated with thicker back gate regions. In this regard, the depletion regions associated with the reduced back gate region can be expanded to overlap with the depletion region associated with a front gate region, during an OFF-state mode of operation for the transistor. This has the effect of substantially reducing Ioff, which improves the overall Ion/Ioff ratio of the semiconductor device. Moreover, by forming depletion region associated with the reduced back gate region more quickly than other depletion regions associated with thicker back gate regions, the transistor can be turned off faster than other transistors.

These and other advantages, features, and objects of the present invention will be more readily understood in view of the following description, drawings, and claims.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE INVENTION

Figure 1:
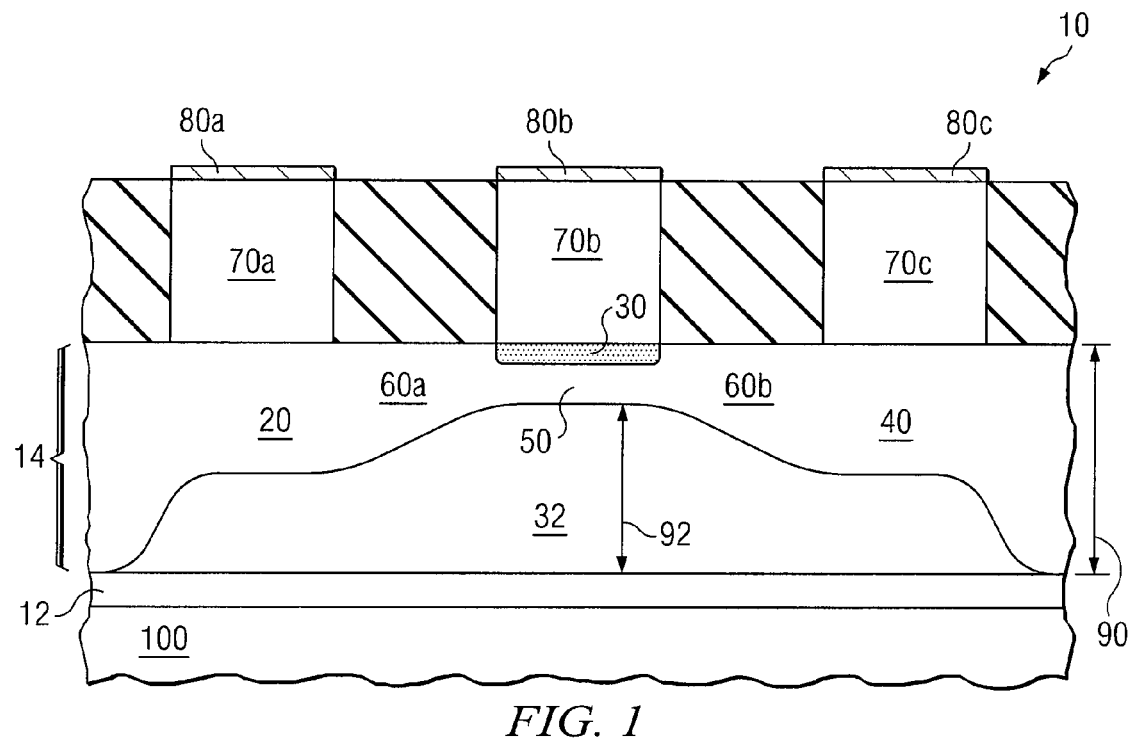
FIG. 1 illustrates one embodiment of a JFET using a silicon-on-insulator architecture.

FIG. 1 illustrates a semiconductor device 10, according to certain embodiments. As shown in FIG. 1, device 10 may comprise an insulating layer 12 formed on a substrate 100, and a silicon region 14 formed on insulating layer 12. Thus, device 10 employs a silicon-on-insulator (SOI) architecture. Device 10 further comprises a source region 20, a front gate region 30, a back gate region 32, a drain region 40, channel region 50, and link regions 60a-b formed in silicon region 14. Device 10 further comprises connection regions 70a-c and contacts 80a-c formed on silicon region 14. The illustrated regions of device 10 are not necessarily drawn to scale. In some embodiments, device 10 is a junction field effect transistor (JFET). When appropriate voltages are applied to device 10 to operate in an ON-state, current flows through channel region 50 between source region 20 and drain region 40. When appropriate voltages are applied to device 10 to operate in an OFF-state, a depletion region is formed adjacent to front gate region 30 and adjacent to back gate region 32 to impede the flow of current between source region 20 and drain region 40. According to certain embodiments, the use of an SOI architecture and back gate region 32 provides improved ON-state and OFF-state operation for device 10.

Substrate 100 represents bulk semiconductor material, such as materials from Group IV of the periodic table such as silicon or germanium, or compound semiconductors comprising elements from Group III and Group V of the periodic table. In particular embodiments, substrate 100 is formed of single-crystal silicon. In other embodiments, substrate 100 is an alloy of silicon and at least one other material, preferably germanium. For example, substrate 100 may be formed of silicon-germanium. In yet other embodiments, substrate 100 is formed of single-crystal germanium or pure germanium. Substrate 100 may have a particular conductivity type, such as p-type or n-type. In particular embodiments, semiconductor device 10 may represent a portion of a substrate 100 that is shared by a plurality of different semiconductor devices (not illustrated in FIG. 1).

Insulating layer 12 may comprise silicon dioxide, sapphire, or any other suitable insulating material formed on substrate 100. Insulating layer 12 may be formed to have any suitable depth using any suitable fabrication technique commonly known to those of skill in the art. Insulating layer 12 generally isolates the active regions of device 10 from substrate 100. This lowers the parasitic capacitance of device 10, which improves power consumption at matched performance. As will described in greater detail below, by isolating the active regions of device 10 from substrate 100, the drive current of device 10 in the ON-state of operation is increased, while the drive current of device 10 in the OFF-state of operation remains substantially the same. As a result, the Ion/Ioff ratio of device 10 having an SOI architecture is increased.

Silicon region 14 comprises silicon to which dopants can be added to form various conductivity regions, such as source region 20, front gate region 30, back gate region 32, drain region 40, channel region 50, and link regions 60a-b. Silicon region 14 of device 10 may have a depth 90 ranging from 60 to 100 nm. In a particular embodiment, depth 90 of silicon region 14 is approximately 70 nm.

Channel region 50 provides a path to conduct current between source region 20 and drain region 40. Channel region 50 is formed by the addition of a first type of dopant to silicon region 14. For example, the first type of dopant may represent particles of n-type doping material such as antimony, arsenic, phosphorous, or any other appropriate n-type dopant. Alternatively, the first type of dopant may represent particles of p-type doping material such as boron, gallium, indium, or any other suitable p-type dopant. Where the channel region 50 is doped with n-type impurities, conduction between drain region 40 and source region 20 is dominated by electrons when an appropriate voltage is applied to the gate and drain terminals of device 10 with respect to the source. Where channel region 50 is doped with p-type impurities, conduction between drain region 40 and source region 20 is dominated by holes when an appropriate voltage is applied to the gate and drain terminals of device 10 with respect to the source. The doping concentration for channel region 50 may range from 1E+17 atoms/cm$^3$ to 1E+20 atoms/cm$^3$. In general, the doping concentration of channel region 50 may be lower than source region 20 and drain region 40. Moreover, the doping concentration for channel region 50 may be maintained such that device 10 operates in an enhancement mode, with a current flowing between drain region 40 and source region 20 when a positive voltage differential is applied between source region 20 and gate regions 30 and 32.

Source region 20 and drain region 40 each comprise regions of device 10 formed by the addition of the first type of dopant to silicon region 14. Thus, for an n-channel device 10, source region 20 and drain region 40 are doped with n-type impurities. For a p-channel device 10, source region 20 and drain region 40 are doped with p-type impurities. In particular embodiments, source region 20 and drain region 40 have a doping concentration at or higher than 1E+19 atoms/cm$^3$. In particular embodiments, source region 20 and drain region 40 are formed by the diffusion of dopants through corresponding connection regions 70a and 70c, respectively. Consequently, in such embodiments, the boundaries and/or dimensions of source region 20 and drain region 40 may be precisely controlled.

In some embodiments, device 10 may comprise link regions 60a and 60b. Link regions 60a and 60b may comprise active regions formed by doping silicon region 14 with n-type or p-type impurities, as appropriate. Because link regions 60a and 60b are of the same conductivity type as source region 20 and drain region 40, the boundary between source region 20 and link region 60a and the boundary between drain region 40 and link region 60b may be undetectable once the particular regions have been formed. For example, in particular embodiments, source region 20 and drain region 40 are formed by diffusing dopants through connection regions 70a and 70b, respectively. Ion implantation may then be used to add dopants to appropriate regions of silicon region 14, thereby forming link regions 60a and 60b. The boundary between source region 20 and link region 60a and the boundary between drain region 40 and link region 60b may be substantially undetectable after semiconductor device 10 is formed. Thus, channel region 50 may provide a path to conduct current between source region 20 and drain region 40 through link regions 60a and 60b.

Front gate region 30 and back gate region 32 are formed by doping silicon region 14 with a second type of dopant. As a result, gate regions 30 and 32 have a second conductivity type. Thus, for an n-channel device 10, gate regions 30 and 32 are doped with p-type impurities. For a p-channel device 10, gate regions 30 and 32 are doped with n-type impurities. In particular embodiments, gate regions 30 and 32 are doped with the second type of dopant to a concentration at or higher than 1E+19 atoms/cm$^3$. Generally, gate regions 30 and 32 are electrically coupled. As described further below, when a voltage is applied to gate regions 30 and 32, the applied voltage alters the conductivity of the neighboring channel region 50 based on the recession or expansion of depletion regions around gate regions 30 and 32, thereby facilitating or impeding the flow of current between source region 20 and drain region 40.

In a particular embodiment of device 10, back gate region 32 has a depth 92 of 35 to 65 nm. The capacitance of device 10 includes the capacitance of front gate region 30 plus the capacitance of back gate region 32. As the area of back gate region 32 is substantially larger than the area of front gate region 30, the capacitance of device 10 contributed by gate regions 30 and 32 is dominated by the capacitance contributed by back gate region 32. As will be described in detail with regard to FIG. 2, reducing the area of back gate region 32 advantageously reduces the overall capacitance of device 10.

Connection regions 70a-c comprise structures that provide an ohmic connection between contacts 80a-c and source region 20, gate region 30, and drain region 40, respectively. Connection regions 70a-c may be formed of polycrystalline silicon, polycrystalline germanium, a silicon-germanium alloy, and/or any suitable material. In particular embodiments, connection regions 70 may connect pins of an integrated circuit package to the various regions of semiconductor device 10. Furthermore, in particular embodiments, source region 20, drain region 40, and gate region 30 are formed by dopants that are diffused through connection regions 70. As a result, in particular embodiments, connection regions 70 may themselves comprise doped material, even after any appropriate diffusion of dopants into the various regions of silicon region 14 has occurred.

Additionally, in particular embodiments, connection regions 70 may be coplanar. Moreover, in particular embodiments, contacts 80 may additionally or alternatively be coplanar so that particular surfaces of all contacts 80 have the same height. Coplanar connection regions 70 and/or contacts 80 may simplify the manufacturing and packaging of semiconductor device 10.

In operation, channel region 50 provides a voltage-controlled conductivity path between source region 20 and drain region 40 through link regions 60. More specifically, a voltage differential between gate regions 30 and 32 and source region 20 (referred to herein as $V_{GS}$) controls conduction through the channel region 50 by increasing or decreasing a width of depletion regions formed within channel region 50. The depletion regions define an area within channel region 50 in which holes and electrons have depleted semiconductor device 10. Because the depletion regions lack charge carriers, they will impede the flow of current between source region 20 and drain region 40 by forming an energy barrier. Moreover, as the depletion regions expand or recede, the portion of channel region 50 through which current can flow grows or shrinks, respectively. As a result, the conductivity of channel region 50 increases and decreases as $V_{GS}$ changes, and semiconductor device 10 may operate as a voltage-controlled current regulator.

Furthermore, in particular embodiments, semiconductor device 10 comprises an enhancement mode device. Thus, when $V_{GS}<0$, the depletion regions pinch off channel region 50 preventing current from flowing between source region 20 and drain region 40. When $V_{GS}>0$, the depletion regions recede to a point that a current flows between source region 20 and drain region 40 through channel region 50 when a positive voltage differential is applied between source region 20 and drain region 40 (referred to herein as $V_{DS}$).

Overall, in particular embodiments, the dimensions of channel region 50, gate regions 30 and 32, source region 20, and/or drain region 40 may reduce the parasitic capacitances created within semiconductor device 10 and may, as a result, allow semiconductor device 10 to operate with reduced drive current. As a result, one or more semiconductors can be combined onto a microchip to form a memory device, processor, or other appropriate electronic device that is capable of functioning with a reduced operational voltage. For example, in particular embodiments of semiconductor device 10, channel region 50 may conduct current between source region 20 and drain region 40 with a $V_{GS}$ of 0.5V or less. Consequently, electronic devices that include semiconductor device 10 may be capable of operating at higher speed and with lower power consumption than conventional semiconductor devices.

Figure 2:
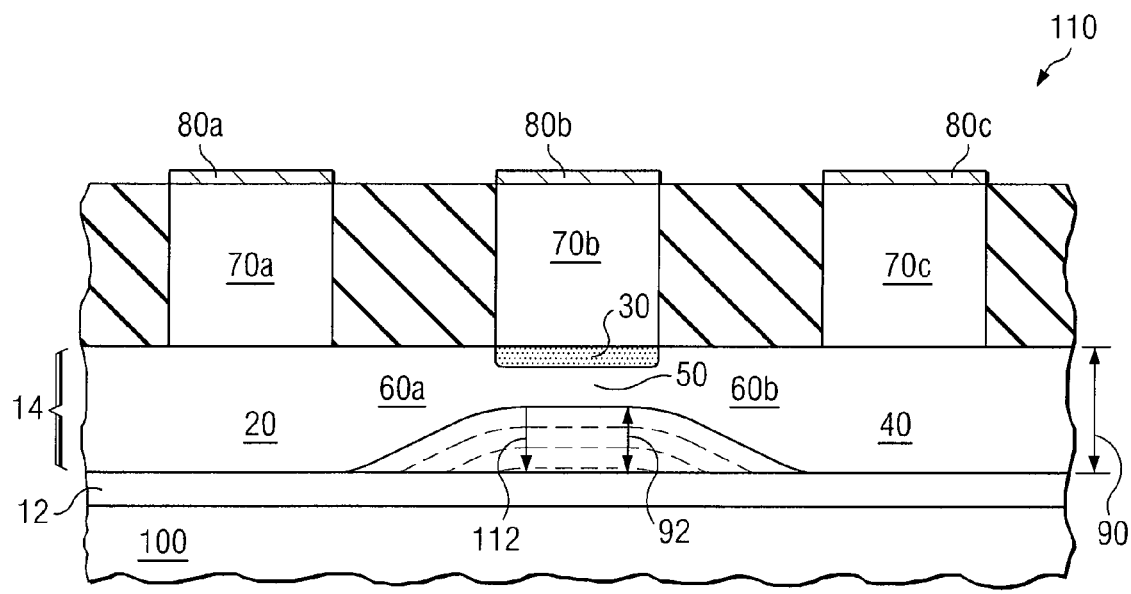
FIG. 2 illustrates one embodiment of a JFET using a thin silicon region of a silicon-on-insulator architecture.

FIG. 2 illustrates one embodiment of a semiconductor device 110 using a thin silicon region 14. As illustrated in FIG. 2, device 110 has the same regions as those illustrated in FIG. 1. Like reference numerals are used to identify like regions from device 10 to device 110. A primary difference between device 110 and device 10 is that the depth 90 of silicon region 14 in device 110 ranges from 10 to 60 nm, as opposed to from 60 to 100 nm in device 10. In a particular embodiment, depth 90 of silicon region 14 in device 110 comprises 50 nm. By reducing the thickness of silicon region 14 in device 110, the depth 92 of back gate region 32 in device 110 is also reduced. In particular, the depth 92 of back gate region 32 ranges from 15 to 25 nm, as opposed to from 35 to 65 nm in device 10. In a particular embodiment, depth 92 of back gate region 32 in device 110 comprises 20 nm.

The reduction in thickness of silicon region 14 in device 110 leads to multiple advantages, such as a reduction of the overall capacitance of device 110, faster switching speeds for device 110, and improved OFF-state operation of device 110. First, reducing the thickness of silicon region 14 in device 110, and thereby reducing the thickness of back gate region 32 in device 110, reduces the capacitance of device 110. As described above, the capacitance of device 110 is based at least in part on the capacitance contributed by front gate region 30 and back gate region 32. Also as described above, as the area of back gate region 32 is substantially larger than the area of front gate region 30, the capacitance of device 10 contributed by gate regions 30 and 32 is dominated by the capacitance contributed by back gate region 32. Reducing the thickness of depth 92 substantially reduces the area of back gate region 32 in device 110 as compared to the area of back gate region 32 in device 10. In one embodiment, the area of back gate region 32 in device 110 is reduced by 50 to 70 percent in comparison to the area of back gate region 32 in device 10. This reduction in area of back gate region 32 in device 110 leads to a two to three times reduction in capacitance of device 110 in comparison to device 10. The reduction in capacitance of device 110 in comparison to other semiconductor devices that do not include an SOI architecture, or that otherwise do not isolate the active regions from the semiconductor substrate, can be even greater. Thus, device 110 using a thin silicon region 14 provides significant advantages with respect to reduction in capacitance.

One advantage of reducing the capacitance of device 110, as described above, is that device 110 can be switched on or off faster than other semiconductor devices, such as device 10. Moreover, by reducing the thickness of back gate region 32, the depletion region associated with back gate region 32 can only recede so far before it abuts insulating layer 12 and cannot recede any further. This recession of the depletion region associated with back gate region 32 of device 110 is represented in FIG. 2 by dashed lines approaching and eventually abutting insulating layer 12, as indicated by arrow 112. With this depletion region only receding up to the insulating layer 12, when appropriate voltages are applied to device 110 to operate it in an OFF-state, the depletion region associated with back gate region 32 can be formed more quickly and/or more robustly than other depletion regions associated with thicker back gate regions. In this regard, the depletion region associated with back gate region 32 in device 110 can be expanded to overlap with the depletion region associated with front gate region 30, during an OFF-state mode of operation for device 110. This has the effect of substantially reducing Ioff, which improves the overall Ion/Ioff ratio of device 110. Moreover, by forming depletion region associated with back gate region 32 of device 110 faster than other depletion regions, device 110 can be turned off faster than other semiconductor devices.

Although the present invention has been described in detail, it should be understood that various changes, substitutions and alterations can be made hereto without departing from the scope of the invention as defined by the appended claims.

What is claimed is:

1. A junction field effect transistor, comprising:
a semiconductor substrate;
an insulating layer formed on the semiconductor substrate;
a silicon region formed on the insulating layer, wherein the silicon region has a depth ranging from ten to sixty nanometers;
a source region of a first conductivity type which is formed in the silicon region;

a drain region of the first conductivity type which is formed in the silicon region and spaced apart from the source region;

a channel region of the first conductivity type which is located between the source and drain regions and formed in the silicon region;

a first gate region of a second conductivity type which is formed adjacent to a top of the silicon region; and a second gate region of the second conductivity type which is formed adjacent to a bottom of the silicon region.

2. The junction field effect transistor of claim 1, further comprising:

a gate contact region formed on a gate electrode region and in ohmic contact with the first gate region;

a source contact region formed on a source electrode region and in ohmic contact with the source region; and a drain contact region formed on a drain electrode region and in ohmic contact with the drain region.

3. The junction field effect transistor of claim 1, wherein the depth of the second gate region ranges from fifteen to twenty-five nanometers.

4. The junction field effect transistor of claim 1, wherein:
the first conductivity type comprises n-type; and
the second conductivity type comprises p-type.

5. The junction field effect transistor of claim 1, wherein:
the first conductivity type comprises p-type; and
the second conductivity type comprises n-type.

6. The junction field effect transistor of claim 1, wherein the channel conducts a current at an operating voltage equal to or less than 0.5 volts.

7. The junction field effect transistor of claim 1, wherein the depth of the silicon region comprises approximately fifty nanometers.

8. The junction field effect transistor of claim 1, wherein the depth of the back gate region comprises approximately twenty nanometers.

9. The junction field effect transistor of claim 1, wherein the first gate region comprises a front gate region and the second gate region comprises a back gate region.

10. The junction field effect transistor of claim 9, wherein an area of the back gate region is reduced in comparison to an area of a back gate region formed in a thicker silicon region.

11. The junction field effect transistor of claim 10, wherein the reduction of the area of the back gate region reduces a capacitance of the JFET.

12. The junction field effect transistor of claim 11, wherein the reduction of capacitance of the JFET increases a Ion/Ioff ratio of the transistor.

13. The junction field effect transistor of claim 11, wherein the reduction of capacitance results in a faster switching speed for the transistor.

14. The junction field effect transistor of claim 9, wherein a depletion region associated with the back gate region recedes substantially up to the insulating layer during an OFF-state of operation of the transistor in response to the depth of the back gate region.

15. The junction field effect transistor of claim 14, wherein a current associated with the OFF-state of operation of the transistor approaches zero in response to the depletion region associated with the back gate region receding substantially up to the insulating layer.

16. A junction field effect transistor, comprising a silicon-on-insulator architecture, a front gate region formed in a silicon region of the SOI architecture, and a back gate region formed in the silicon region, wherein the silicon region is thin and the back gate region has a small depth, whereby a depletion region associated with the back gate region recedes substantially up to an insulating layer of the SOI architecture.

17. The junction field effect transistor of claim 16, wherein the depth of the silicon region ranges from ten to sixty nanometers.

18. The junction field effect transistor of claim 16, wherein the depth of the back gate region ranges from fifteen to twenty-five nanometers.

19. The junction field effect transistor of claim 16, wherein the thin depth of the back gate region reduces a capacitance associated with the transistor resulting in at least one of:
a faster switching speed for the transistor; and
an improved Ion/Ioff ratio for the transistor.

20. A junction field effect transistor, comprising:
a semiconductor substrate;
an insulating layer formed on the semiconductor substrate;
a silicon region formed on the insulating layer, wherein the silicon region has a depth ranging from ten to sixty nanometers;
a source region of a first conductivity type which is formed in the silicon region;
a drain region of the first conductivity type which is formed in the silicon region and spaced apart from the source region;
a channel region of the first conductivity type which is located between the source and drain regions and formed in the silicon region;
a front gate region of a second conductivity type which is formed in the silicon region; and
a back gate region of the second conductivity type which is formed in the silicon region and has a depth ranging from fifteen to twenty-five nanometers;
wherein:
an area of the back gate region is reduced in comparison to an area of a back gate region formed in a thicker silicon region such that a capacitance of the transistor is reduced; and
a depletion region associated with the back gate region recedes substantially up to the insulating layer during an OFF-state of operation of the transistor in response to the depth of the back gate region.

21. The junction field effect transistor of claim 20, wherein the reduced capacitance of the transistor results in at least one of:
a faster switching speed for the transistor; and
an improved Ion/Ioff ratio for the transistor.

22. The junction field effect transistor of claim 20, wherein a current associated with the OFF-state of operation of the transistor approaches zero in response to the depletion region associated with the back gate region receding substantially up to the insulating layer.

* * * * *